United States Patent
Gao et al.

(10) Patent No.: US 11,119,175 B2
(45) Date of Patent: Sep. 14, 2021

(54) SYSTEMS AND METHODS FOR SUPPRESSING NYQUIST GHOST FOR DIFFUSION WEIGHTED MAGNETIC RESONANCE IMAGING

(71) Applicant: GE Precision Healthcare LLC, Wauwatosa, WI (US)

(72) Inventors: Lei Gao, Beijing (CN); Juan Gao, Beijing (CN); Xuan Liu, Beijing (CN); Yongchuan Lai, Beijing (CN); Jiabin Yao, Beijing (CN); Richard S Hinks, Waukesha, WI (US)

(73) Assignee: GE PRECISION HEALTHCARE, Wauwatosa, WI (US)

( * ) Notice: Subject to any disclaimer, the term of this patent is extended or adjusted under 35 U.S.C. 154(b) by 29 days.

(21) Appl. No.: 16/733,731

(22) Filed: Jan. 3, 2020

(65) Prior Publication Data
US 2021/0208230 A1    Jul. 8, 2021

(51) Int. Cl.
*G01R 33/565* (2006.01)
*G01R 33/561* (2006.01)
*G01R 33/563* (2006.01)

(52) U.S. Cl.
CPC ... *G01R 33/56545* (2013.01); *G01R 33/5616* (2013.01); *G01R 33/56341* (2013.01)

(58) Field of Classification Search
CPC .......... G01R 33/56545; G01R 33/5616; G01R 33/56341
See application file for complete search history.

(56) References Cited

U.S. PATENT DOCUMENTS 10,043,243 B2 * 8/2018 Matviychuk ............. G06K 9/52

OTHER PUBLICATIONS

QS Xiang et.al. Magnetic Resonance in Medicine 57:731-741 (2007) "Correction for Geometric Distortion and N/2 Ghosting in EPI by Phase Labeling for Additional Coordinate Encoding (PLACE)".

* cited by examiner

*Primary Examiner* — Susan S Lee
(74) *Attorney, Agent, or Firm* — Armstrong Teasdale LLP

(57) ABSTRACT

Systems and methods for suppressing Nyquist ghost for diffusion weighted magnetic resonance imaging are disclosed. An exemplary method includes acquiring multiple k-space data sets using multiple sets of diffusion weighted imaging pulse sequences, reconstructing a magnetic resonance image from each of the multiple k-space data sets respectively, and averaging magnitudes of the magnetic resonance images to generate an average magnitude magnetic resonance image.

19 Claims, 4 Drawing Sheets

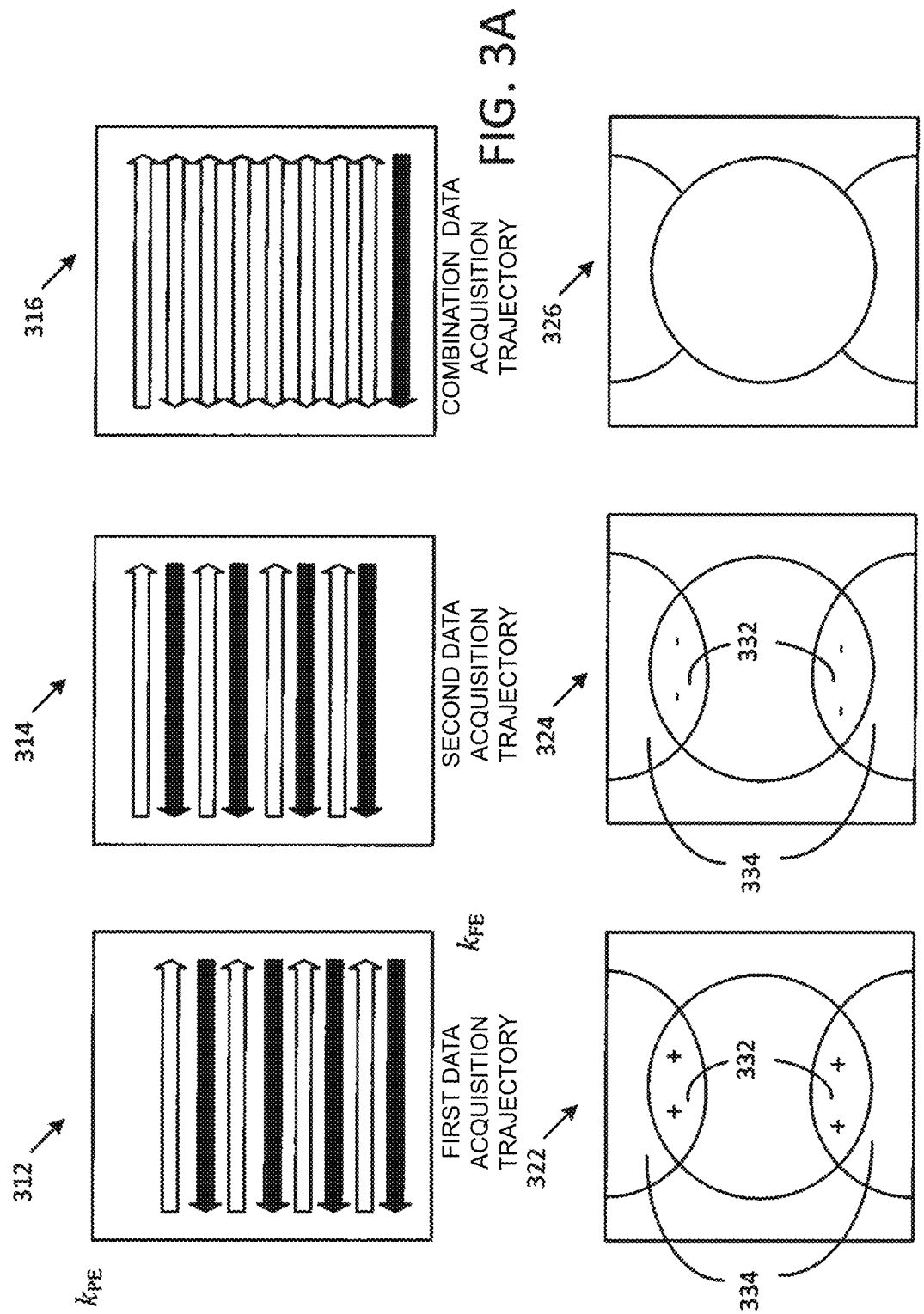

SYSTEMS AND METHODS FOR SUPPRESSING NYQUIST GHOST FOR DIFFUSION WEIGHTED MAGNETIC RESONANCE IMAGING

FIELD

This disclosure relates to magnetic resonance imaging (MRI), and more particularly, to diffusion weighted imaging (DWI).

BACKGROUND

Diffusion weighted magnetic resonance imaging (DW-MRI) has been evolving and is becoming instrumental in diagnosis and investigation of tissue functions in various organs (e.g., brain, cartilage, and liver) and for various applications (e.g., pathology, oncology). Diffusion refers to the random motions of molecules in a system. In biological tissues, diffusion of water molecules forms a pattern according to tissue structure and properties. In pathological conditions such as acute stroke, the diffusion pattern may be disturbed and the amount of diffusion may change in affected area. Abnormities of tissues can thus be detected through studying the changes in diffusion. A specialized magnetic resonance imaging (MRI) technique called diffusion weighted imaging (DWI) exploits the diffusion of water molecules to visualize internal physiology. The image contrast in DWI reflects the difference in rate of diffusion between tissues. DWI is particularly useful in situations where conventional MRI sequences (e.g., T2 weighted imaging) do not show significant changes in the images. For example, in pathological conditions like stroke arising from ischemia, signal intensity on T2 does not change until at least 8 hours after the onset of the stroke. On the other hand, DWI can show the changes in brain as early as 30 minutes after the onset of the stroke and reveal dramatic signal difference within an hour of the onset.

Generally, spin-echo is the sequence of choice for DWI. For example, a DWI sequence may include a pulsed gradient spin echo (PGSE) portion appended as a preparation phase to the front of an echo-planar imaging (EPI) sequence. EPI is an ultrafast MRI technique wherein an entire image can be formed with magnetic resonance (MR) signals generated by a single radio frequency (RF) excitation. EPI pulse sequences are composed of a train of echoes, one echo generated for each line of k-space following a zig-zag trajectory through k-space. In the zig-zag acquisition, two adjacent echoes are acquired in opposite directions. If the forward and backward echoes are not perfect mirror images of each other, then artifacts are introduced into the image at reconstruction. For example, a delay of the start of the first echo will be propagated into all later echoes, resulting in timing differences between the peaks of odd- and even-numbered echoes. When the Fourier transform is performed, this phase error would result in signal intensity displaced in the phase-encoding direction halfway across the image, which is called the Nyquist ghost. If there are N pixels across the field of view (FOV), this aliased ghost appears shifted N/2 pixels relative to the main image positioned at the correct location. Nyquist ghosts may result from many possible causes, such as eddy currents induced in coils and the magnet housing in response to rapidly changing gradients pulses, poor shimming, gradient coil heating, patient motion, and so on.

To address the Nyquist ghost in EPI, Qing-San Xiang et al. introduced a method called "phase labeling for additional coordinate encoding" (PLACE). (See "Correction for Geometric Distortion and N/2 Ghosting in EPI by Phase Labeling for Additional Coordinate Encoding (PLACE)" *Magnetic Resonance in Medicine* 57:731-741 (2007), Qing-San Xiang et al.). Two sets of k-space data are acquired by using two slightly different EPI pulse sequences. One EPI pulse sequence adds a small gradient area in the phase-encoding direction comparing to the other EPI pulse sequence, resulting in swapped odd and even-numbered echoes and thus Nyquist ghosting with an opposite polarity. The two sets of k-space data are averaged, and an MR image is reconstructed from the average k-space data. Or, MR complex images are reconstructed from the two sets of k-space data respectively and are averaged to generate the final average MR image. The Nyquist ghost is suppressed in the MR image. However, the average of complex values used in the method of PLACE is not suitable for DWI because it would substantially decrease the signal magnitude due to the phase difference between the two acquisitions when diffusion gradients are applied. An improved method for suppressing the Nyquist ghost for DWI is generally desired.

SUMMARY

In one embodiment, the present disclosure provides a method for suppressing Nyquist ghost for diffusion weighted magnetic resonance imaging. The method comprises acquiring multiple k-space data sets using multiple sets of diffusion weighted imaging pulse sequences, reconstructing a magnetic resonance image from each of the multiple k-space data sets respectively, and averaging magnitudes of the magnetic resonance images to generate an average magnitude magnetic resonance image.

In another embodiment, the present disclosure provides an MRI system. The MRI system comprises gradient coils configured to generate encoding gradients, a radio frequency (RF) coil configured to generate RF pulses, and a processor connected to the gradient coils and the RF coil. The processor is configured to instruct the gradient coils and the RF coil to generate multiple sets of diffusion weighted imaging pulse sequences to acquire multiple k-space data sets, reconstruct a magnetic resonance image from each of the multiple k-space data sets respectively, and average magnitudes of the magnetic resonance images to generate an average magnitude magnetic resonance image.

In yet another embodiment, the present disclosure provides a method for suppressing Nyquist ghost in diffusion weighted magnetic resonance imaging. The method comprises acquiring a first k-space data set using a first set of diffusion weighted imaging pulse sequences and acquiring a second k-space data set using a second set of diffusion weighted imaging pulse sequences. Odd- and even-numbered echoes of the second first k-space data set are swapped with respect to the first k-space data set. The method further comprises reconstructing a first magnetic resonance image from the first k-space data set, reconstructing a second magnetic resonance image from the second k-space data set, and averaging magnitudes of the first and second magnetic resonance images to generate an average magnitude magnetic resonance image.

BRIEF DESCRIPTION OF THE DRAWINGS

Various aspects of this disclosure may be better understood upon reading the following detailed description and upon reference to the drawings in which:

FIG. 3A is a schematic diagram of k-space data acquisition trajectories according to the pulse sequences of FIG. 2 and a combination thereof according to PLACE;

FIG. 3B is a schematic diagram of MR images reconstructed from k-space data acquired according to FIG. 3A and a combination thereof, in accordance with an exemplary embodiment;

Figure 1:
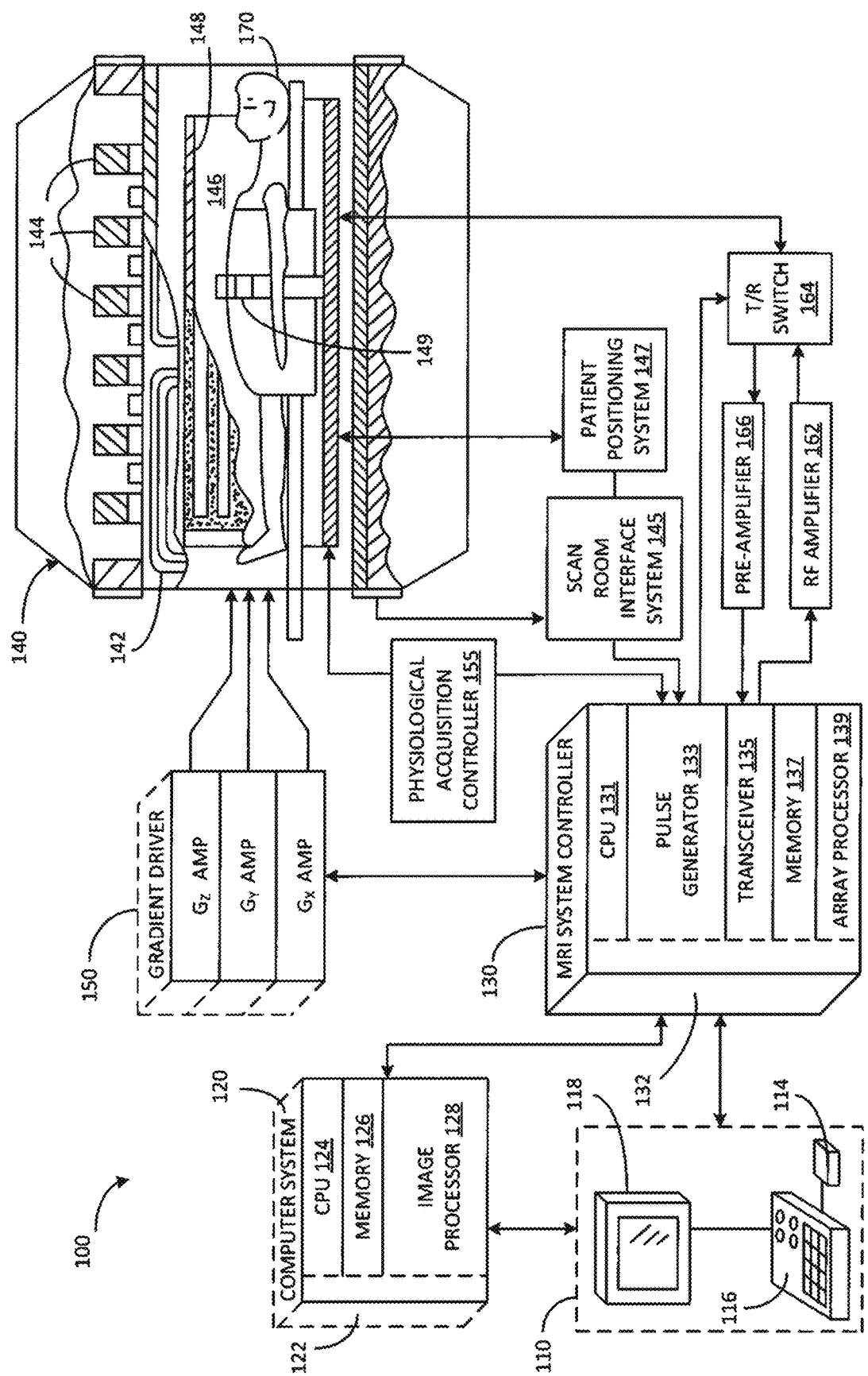
FIG. 1 is a schematic diagram of a magnetic resonance imaging (MRI) system, in accordance with an exemplary embodiment.

The drawings illustrate specific aspects of the described components, systems and methods for suppressing Nyquist ghost for DW-MRI. Together with the following description, the drawings demonstrate and explain the principles of the structures, methods, and principles described herein. In the drawings, the thickness and size of components may be exaggerated or otherwise modified for clarity. Well-known structures, materials, or operations are not shown or described in detail to avoid obscuring aspects of the described components, systems and methods.

DETAILED DESCRIPTION

One or more specific embodiments of the present disclosure are described below in order to provide a thorough understanding. These described embodiments are only examples of the systems and methods for suppressing Nyquist ghost for DW-MRI. The skilled artisan will understand that specific details described in the embodiments can be modified when being placed into practice without deviating the spirit of the present disclosure.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. In addition, it should be understood that references to "one embodiment" or "an embodiment" of the present disclosure are not intended to be interpreted as excluding the existence of additional embodiments that also incorporate the recited features.

Referring to the figures generally, the present disclosure describes systems and methods for suppressing Nyquist ghost for DWI. Multiple sets of k-space data are acquired by using multiple sets of slightly different DWI pulse sequences. Each set of DWI pulse sequences includes a PGSE portion appended as a preparation phase to the front of an EPI sequence. Odd and even-numbered echoes are swapped among the multiple sets of DWI sequences by slightly varying the gradient area in the phase-encoding direction. That is to say, forward echoes in one group of DWI sequences become backward echoes in the other group and vice versa. MR images are reconstructed from each of the multiple sets of k-space data respectively. Magnitudes of the MR images are averaged to generate an average MR image. In this way, the Nyquist ghost is suppressed in the average MR image. Since the magnitude average is used, the signal intensity is not decreased and thus a good signal to noise ratio (SNR) can be achieved.

Referring now to FIG. 1, a schematic diagram of an exemplary MRI system 100 is shown in accordance with an exemplary embodiment. The operation of MRI system 100 is controlled from an operator workstation 110 which includes an input device 114, a control panel 116, and a display 118. The input device 114 may be a joystick, keyboard, mouse, track ball, touch activated screen, voice control, or any similar or equivalent input device. The control panel 116 may include a keyboard, touch activated screen, voice control, buttons, sliders, or any similar or equivalent control device. The operator workstation 110 is coupled to and communicates with a computer system 120 that enables an operator to control the production and viewing of images on display 118. The computer system 120 includes a plurality of components that communicate with each other via electrical and/or data connections 122. The computer system connections 122 may be direct wired connections, fiber optic connections, wireless communication links, or the like. The computer system 120 may include a central processing unit (CPU) 124, a memory 126, and an image processor 128. In some embodiments, the image processor 128 may be replaced by image processing functionality implemented in the CPU 124. The computer system 120 may be connected to archival media devices, permanent or back-up memory storage, or a network. The computer system 120 is coupled to and communicates with a separate MRI system controller 130.

The MRI system controller 130 includes a set of components in communication with each other via electrical and/or data connections 132. The MRI system controller connections 132 may be direct wired connections, fiber optic connections, wireless communication links, or the like. The MRI system controller 130 may include a CPU 131, a pulse generator/sequencer 133 communicating with the operator workstation 110, a transceiver (or RF transceiver) 135, a memory 137, and an array processor 139. In some embodiments, the pulse generator/sequencer 133 may be integrated into a resonance assembly 140 of the MRI system 100. The MRI system controller 130 may receive commands from the operator workstation 110 to indicate the MRI scan sequence to be performed during an MRI scan. The MRI system controller 130 is also coupled to and communicates with a gradient driver system 150, which is coupled to a gradient coil assembly 142 to produce magnetic field gradients during an MRI scan.

The pulse generator/sequencer 133 may also receive data from a physiological acquisition controller 155 which receives signals from a plurality of different sensors connected to an object or patient 170 undergoing an MM scan, such as electrocardiography (ECG) signals from electrodes attached to the patient. And finally, the pulse generator/sequencer 133 is coupled to and communicates with a scan room interface system 145, which receives signals from various sensors associated with the condition of the resonance assembly 140. The scan room interface system 145 is also coupled to and communicates with a patient positioning system 147, which sends and receives signals to control movement of a patient table to a desired position for an MRI scan.

The MRI system controller 130 provides gradient waveforms to the gradient driver system 150, which includes, among others, $G_X$, $G_Y$ and $G_Z$ amplifiers. Each $G_X$, $G_Y$ and $G_Z$ gradient amplifier excites a corresponding gradient coil in the gradient coil assembly 142 to produce magnetic field gradients used for spatially encoding MR signals during an MRI scan. The gradient coil assembly 142 is included within the resonance assembly 140, which also includes a superconducting magnet having superconducting coils 144, which in operation, provides a static homogenous longitudinal magnetic field $B_0$ throughout a cylindrical imaging volume 146 that is enclosed by the resonance assembly 140. The resonance assembly 140 also includes a RF body coil 148 which in operation, provides a transverse magnetic field $B_1$ that is generally perpendicular to $B_0$ throughout the open cylindrical imaging volume 146. The resonance assembly 140 may also include RF surface coils 149 used for imaging different anatomies of a patient undergoing an MRI scan. The RF body coil 148 and RF surface coils 149 may be configured to operate in a transmit and receive mode, transmit mode, or receive mode.

A subject or patient 170 undergoing an MRI scan may be positioned within the cylindrical imaging volume 146 of the resonance assembly 140. The transceiver 135 in the MRI system controller 130 produces RF excitation pulses that are amplified by an RF amplifier 162 and provided to the RF body coil 148 through a transmit/receive switch (T/R switch) 164.

As mentioned above, RF body coil 148 and RF surface coils 149 may be used to transmit RF excitation pulses and/or to receive resulting MR signals from a patient undergoing an MRI scan. The resulting MR signals emitted by excited nuclei in the patient undergoing an MRI scan may be sensed and received by the RF body coil 148 or RF surface coils 149 and sent back through the T/R switch 164 to a pre-amplifier 166. The T/R switch 164 may be controlled by a signal from the pulse generator/sequencer 133 to electrically connect the RF amplifier 162 to the RF body coil 148 during the transmit mode and connect the pre-amplifier 166 to the RF body coil 148 during the receive mode. The T/R switch 164 may also enable RF surface coils 149 to be used in either the transmit mode or receive mode.

In some embodiments, the resulting MR signals sensed and received by the RF body coil 148 or RF surface coil 149 and amplified by the pre-amplifier 166 are stored as an array of raw k-space data in memory 137 for post-processing. An MR scan is complete when the array of raw k-space data, corresponding to the received MR signals, has been acquired and stored temporarily in the memory 137 until the data is subsequently transformed to create images.

In some embodiments, the MR signals sensed and received by the RF body coil 148 or RF surface coil 149 and amplified by the pre-amplifier 166 are demodulated, filtered and digitized in the receive section of the transceiver 135 and transferred to the memory 137 in the MRI system controller 130. This data is rearranged into separate k-space data arrays for each image to be reconstructed, and each of these separate k-space data arrays is input to the array processor 139, which operates to Fourier transform the data into arrays of image data.

The array processor 139 uses a transformation method, most commonly a Fourier transform, to create images from the received MR signals. These images are communicated to the computer system 120 where they are stored in memory 126. In response to commands received from the operator workstation 110, the image data may be archived in long-term storage or it may be further processed by the image processor 128 and conveyed to the operator workstation 110 for presentation on the display 118.

In various embodiments, the components of computer system 120 and MRI system controller 130 may be implemented on the same computer system or a plurality of computer systems. It should be understood that the MRI system 100 shown in FIG. 1 is for illustration. An appropriate MRI system may include more, fewer, and/or different components.

Figure 2:
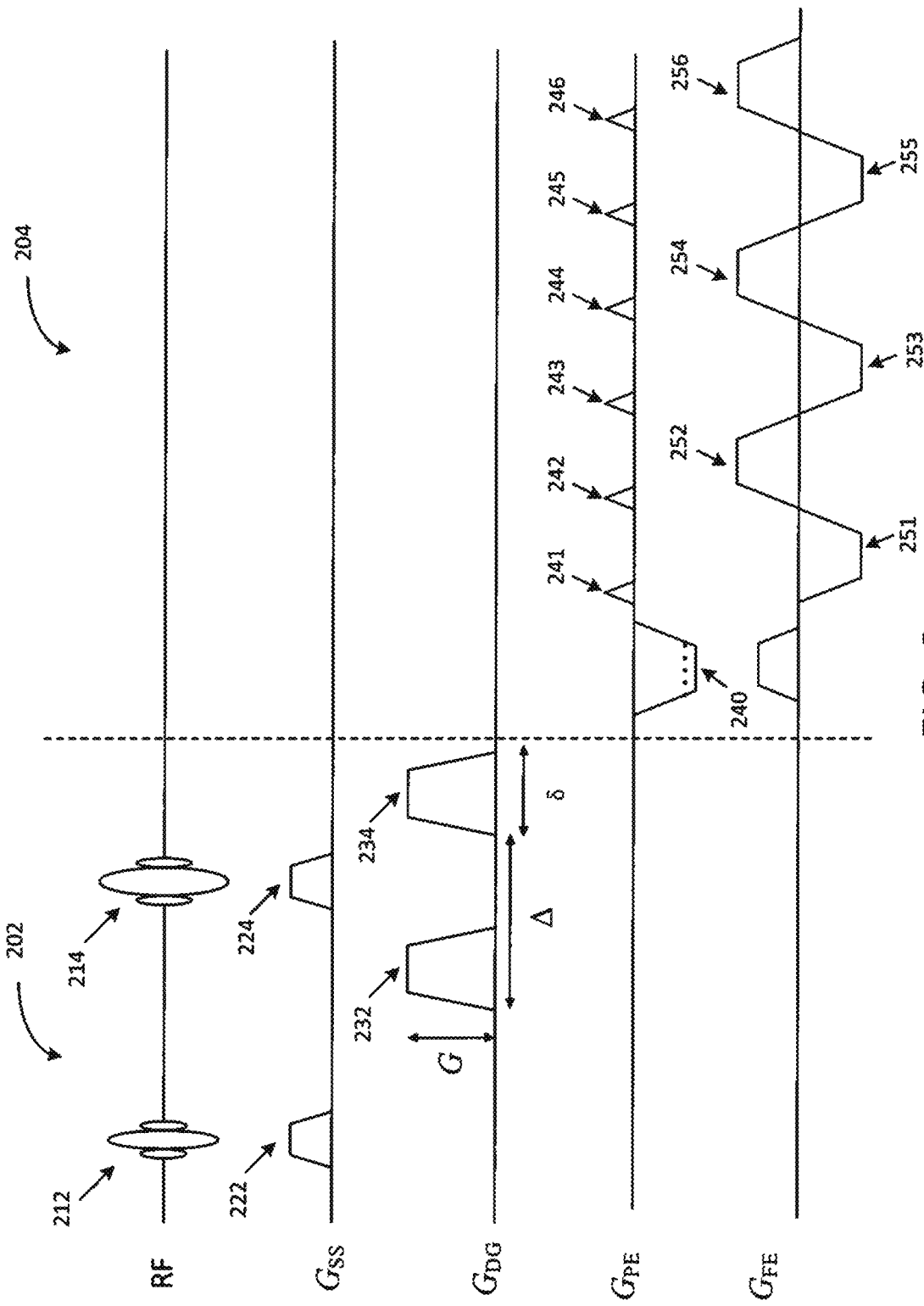
FIG. 2 is a schematic graph of pulse sequences for DWI with suppressed Nyquist ghost, in accordance with an exemplary embodiment.

Referring to FIG. 2, a schematic graph of pulse sequences for suppressing the Nyquist ghost for DWI is shown, in accordance with an exemplary embodiment. Each set of DWI pulse sequences includes a PGSE portion 202 appended as a preparation phase to the front of an EPI sequence 204. The PGSE portion 202 consists of a 90° RF pulse 212 (applied with a slice selection (SS) gradient 222) and a 180° RF pulses 214 (applied with a SS gradient 224) with two diffusion gradients 232 and 234 placed on either side of the 180° RF pulse 214. The RF pulses 212 and 214 may be produced by the transmit coil (e.g., RF body coil 148 in FIG. 1). The gradients 222, 224, 232, and 234 may be produced by the gradient coils (e.g., gradient coil assembly 142 in FIG. 1). In some embodiments, DWI sequences may utilize fat suppression to suppress chemical shift artifacts, which may be, for example, a chemically-selective fat saturation pulse or a nonselective "STIR-like" inverting pulse applied immediately before the 90° RF pulse 212. In some embodiments, the 90° RF pulse 212 itself may be selectively tuned to excite water protons only.

The two strong sensitizing diffusion gradients 232 and 234, one dephasing and one exactly opposite rephasing gradient, are symmetric to the 180° RF pulse 214. The first diffusion gradient 232 introduces phase shift to the protons depending on their positions while the second diffusion gradient 234 reverses the change made by the first diffusion gradient 232. Phases of stationary spins are unaffected by the diffusion gradient pair 232 and 234 since any phase accumulation from the first diffusion gradient 232 is reversed by the second diffusion gradient 234. Diffusing spins, however, move into different locations between the first and second diffusion gradients 232 and 234, falling out of phase and losing signal. That is to say, if protons move, the second diffusion gradient 234 would not be able to completely undo the phase shifts induced by the first diffusion gradient 232. As a result, there would be signal attenuation. This signal attenuation from net movement of protons is given by Stejskal-Tanner equation:

$$S(b)=S_0 e^{-bD} \qquad (1),$$

wherein S(b) is the signal received with particular diffusion gradient pair being applied and $S_0$ is the signal strength without any diffusion gradients, D is the diffusion or Apparent Diffusion Coefficient (ADC), and b is the degree of diffusion weighting for the particular diffusion gradient pair. The value of b may be controlled by manipulating the strength, duration, and separation of the diffusion gradient pair 232 and 234. In particular, the value of b is given by:

$$b = \gamma^2 G^2 \delta^2 \left(\Delta - \frac{\delta}{3}\right), \qquad (2)$$

wherein $\gamma$ is the gyromagnetic ratio of hydrogen proton, a constant, G is the amplitude of the diffusion gradient, $\delta$ is the duration of the diffusion gradient, and Δ is the time between the application of two diffusion gradients. In clinical applications, oftentimes sequences are arranged to provide multiple images with a range of diffusion directions and b-values, and sometimes an ADC map may be calculated. For example, several DW images with different b-values can be obtained by altering the configuration of the diffusion gradient pair. At higher b-value, the effect of diffusion is more pronounced in the image and tissues with high diffusion as seen as hypo-intense regions in the image while tissues with restricted diffusion are seen as hyper-intense regions.

Immediately following the second diffusion gradient 234, k-space data acquisition is performed. This is typically an echo-planar sequence 204 using rapidly oscillating phase-encoding (PE) and frequency-encoding (FE) gradients that generate multiple gradient echoes. The PE and FE gradients may be produced by the gradient coils (e.g., gradient coil assembly 142 in FIG. 1). Rapid image acquisition can minimize the effects of bulk motion on the DW images. As shown in FIG. 2, a blipped EPI sequence is used for data acquisition. In blipped EPI, after a first large PE gradient 240, a plurality of small PE gradient "blips" are each place at the FE gradient reversal. For example, blip 241 is placed at start of negative FE (or readout) gradient 251; blip 242 is placed at the reversal of negative readout gradient 251 to positive readout gradient 252, blip 243 is placed at the reversal of positive readout gradient 252 to negative readout gradient 253, and so on. The blips are of constant size and each add further phase encoding to the previous blips.

Referring to FIG. 3A, a schematic diagram of k-space data acquisition trajectories is shown according to the pulse sequences of FIG. 2. In 312, k-space data are first acquired along the lowest line with the presence of FE gradient 251. When blip 242 is applied, data are acquired along the second lowest line with the presence of FE gradient 252, and so on. Every blip adds a constant phase encoding to the previous blips, which results in a regular path through k-space. Amplitudes of FE gradients 251, 252, 253, 254, 255, and 256 are usually large so that appropriate values can be sampled quickly, and the whole set of data can be collected within a single free induction decay (FID). Because a reasonable diffusion time is needed for the PGSE preparation phase, the echo time (TE) value of the DWI pulse sequence may be quite high, typically greater than 100 ms.

Referring back to FIG. 2, as discussed above, multiple k-space data sets are acquired by using multiple sets of slightly different DWI pulse sequences. In the second set of DWI pulse sequences, a small PE gradient area is subtracted from the large PE gradient 240, as shown by the dotted line. The subtracted area equals a single blip for one PE step. Therefore, the k-space data acquisition trajectory corresponding to this second DWI pulse sequence becomes 314 in FIG. 3A. The trajectory as a whole moves up one PE step. The odd- and even-numbered echoes are swapped with respect to the first set of DWI pulse sequences. The forward echoes (or lines) in the first DWI pulse sequence become backward echoes (or lines) in the second DWI pulse sequence while the backward echoes in the first become forward in the second.

Although two DWI pulse sequences are shown in FIG. 2, it should be understood that more than two DWI pulse sequences can be applied. For example, a third DWI pulse sequence may add a small PE gradient area to the large PE gradient 240. The added area equals a single blip for one PE step so that the k-space data acquisition trajectory is moved down one PE step. Any appropriate number of k-space data sets can be acquired based on the applications, such as 2, 3, 4, etc.

After multiple k-space data sets are acquired according to the DWI pulse sequences (e.g., those shown in FIG. 2), an MR image is reconstructed from each k-space data set, respectively. In some embodiments, the reconstruction includes Fourier transform from k-space to image space, as known in the art. Then magnitudes of the multiple MR images are averaged to generate an average MR image:

$$I = \frac{1}{n}(I_1 + I_2 + \cdots I_n), \text{ if } n \text{ is even;} \tag{3}$$

$$I = \frac{1}{n+1}(I_1 + I_2 + \cdots I_n + I_{n-1}) \text{ if } n \text{ is odd,}$$

wherein n is the number of multiple acquisitions, $I_1$ through $I_n$ are MR magnitudes for each acquisition respectively, and I is the average MR magnitude. 316 in FIG. 3A schematically shows the combination of 312 and 314 in k-space according to the method of PLACE proposed by Xiang et al. (See "Correction for Geometric Distortion and N/2 Ghosting in EPI by Phase Labeling for Additional Coordinate Encoding (PLACE)" *Magnetic Resonance in Medicine* 57:731-741 (2007), Qing-San Xiang et al.). The two sets of k-space data are averaged to cancel out the Nyquist ghosting with opposite polarities.

On the other hand, 326 in FIG. 3B schematically shows the combination of 322 and 324 in real space (or image space) according to the method described herein. Although combination of two k-space data acquisitions is used herein for illustration, it should be understood that the combination applies to more than two acquisitions. In each acquisition, Nyquist ghosts appear both in the signal region (e.g., region 332 in the circle) and outside of the signal region (i.e., region 334 outside the circle). In the first acquisition, for example, the ghost signal may have an opposite polarity to the MR signal in the signal region (i.e., region 332), and thus the overall magnitude in region 332 is |MR+Ghost|. Outside the signal region (i.e., region 334), the magnitude in region 334 is Ghost. In the second acquisition, the odd- and even-numbered echoes are swapped with respect to the first acquisition. Therefore, the ghost signal now has the same polarity as the MR signal in the signal region (i.e., region 332), and thus the overall magnitude in region 332 is |MR−Ghost|. The magnitude outside the signal region (i.e., region 334) remains Ghost for the second acquisition.

Generally, the magnitude of MR signal is larger than the magnitude of ghost signal (i.e., MR>Ghost). As such, when magnitudes of the first and second acquisitions are averaged, the ghost artifact is canceled out in the signal region (i.e., region 332) and only the MR signal remains. The ghost artifact outside the signal region (i.e., region 334) may have a small magnitude comparing to the MR signal and may be removed at post-processing by adjusting the window center.

Figure 4:
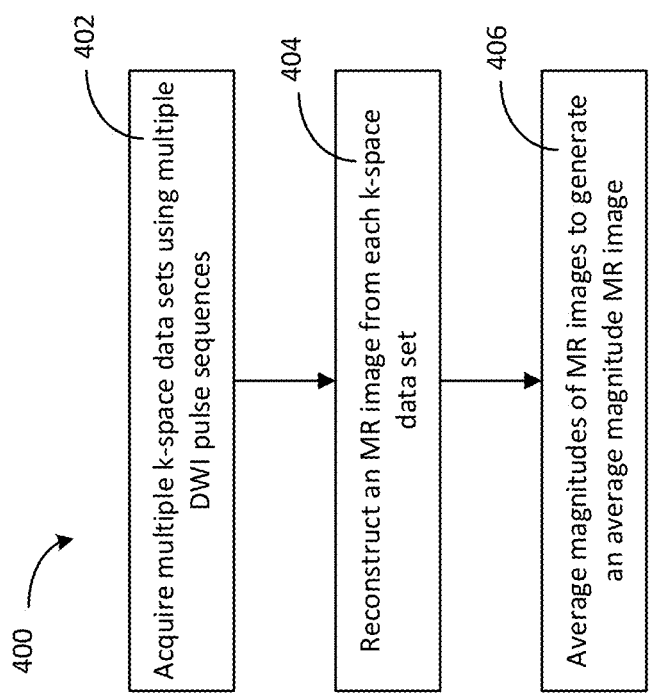
FIG. 4 is a flow chart of a method for suppressing Nyquist ghost for DWI, in accordance with an exemplary embodiment.

Referring to FIG. 4, a flow chart 400 of a method for suppressing Nyquist ghost for DWI is shown in accordance with an exemplary embodiment. The method can be performed by an MRI system, (e.g., the MRI system 100 in FIG. 1). At operation 402, multiple k-space data sets are acquired using multiple sets of slightly different DWI pulse sequences respectively. The DWI sequences may be similar to or the same as the DWI sequences shown in FIG. 2. Each set of DWI pulse sequences includes a PGSE portion and an EPI sequence following the PGSE portion. The PGSE portion includes a pair of diffusion gradients, one dephasing and one exactly opposite rephasing gradient, symmetric to a 180° RF pulse. The first diffusion gradient introduces phase shift to the protons depending on their positions while the second diffusion gradient reverses the change made by the first diffusion gradient. Phases of stationary spins are unaffected by the diffusion gradient pair since any phase accumulation from the first diffusion gradient is reversed by the second diffusion gradient. If the protons move, the second diffusion gradient would not be able to completely undo the phase shifts induced by the first diffusion gradient and there would be signal attenuation. The degree of diffusion weighting may be controlled by manipulating the configuration of the diffusion gradient pair (e.g., strength, duration, and separation of the diffusion gradient pair).

The readout sequence following the PGSE portion may include a blipped EPI sequence. In blipped EPI, after a large PE gradient, a plurality of small PE gradient "blips" are each place at a FE gradient reversal. The blips are of constant size and each add further phase encoding to the previous blips, which results a regular path in k-space. The even-numbered echoes are in opposite direction to the odd-numbered echoes in terms of k-space data acquisition. For example, if the odd-numbered echoes (or lines) are forward, the even-numbered echoes (or lines) are backward, and vice versa.

Among the multiple acquisitions, odd- and even-numbered echoes in one group are swapped with respect to the other group. Take two sets of k-space data acquisition as an example. The forward echoes (or lines) in the first acquisition become backward echoes (or lines) in the second acquisition while the backward echoes (or lines) in the first become forward in the second.

At operation 404, after multiple sets of k-space data are acquired according to the multiple sets of DWI pulse sequences, an MR image is reconstructed from each k-space data set, respectively. In some embodiments, the reconstruction includes Fourier transform from k-space to image space, as known in the art.

At operation 406, magnitudes of the multiple MR images are averaged to generate an average magnitude MR image. The ghost artifact in the signal region is canceled out by averaging the magnitudes of multiple acquisitions. The ghost artifact outside of the signal region may have a small magnitude comparing to the signal and may be removed at post-processing by adjusting the window center, for example.

Figure 5:
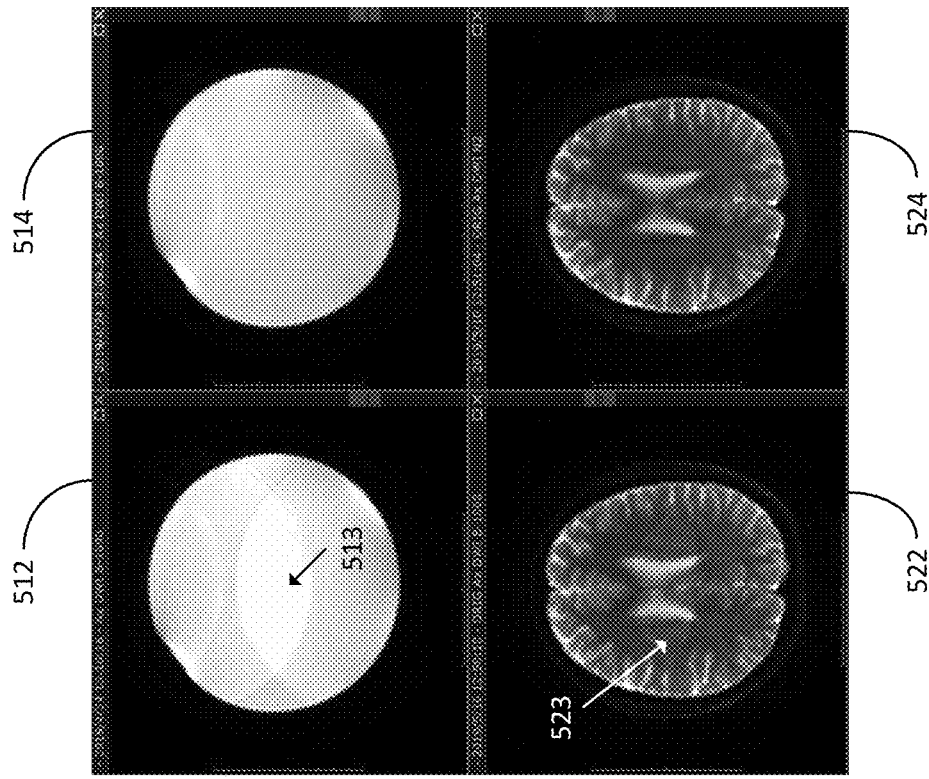
FIG. 5 illustrates diffusion weighted images obtained by the method disclosed herein in comparison with diffusion weighted images obtained by conventional method, in accordance with an exemplary embodiment.

Referring to FIG. 5, diffusion weighted images obtained by the method disclosed herein are compared with diffusion weighted images obtained by conventional method, in accordance with an exemplary embodiment. Image 512 was acquired on a phantom using the conventional method in which a single set of DWI pulse sequences was used. Nyquist ghost 513 was clearly visible in the image. As a comparison, image 514 was acquired on the same phantom using the average magnitude method described herein. It can be seen that the Nyquist ghost was substantially suppressed. Image 522 was an axial brain image acquired on a volunteer using the conventional method in which a single set of DWI pulse sequences was used. Nyquist ghost 523 was clearly visible in the image. As a comparison, image 524 was an axial brain image acquired on the same volunteer using the average magnitude method described herein. It can be seen that the Nyquist ghost was substantially suppressed.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

What is claimed is:

1. A method for suppressing Nyquist ghost for diffusion weighted magnetic resonance imaging, the method performed by a magnetic resonance imaging (MRI) system including gradient coils, a radio frequency (RF) coil, and a processor connected to the gradient coils and the RF coil, the method comprising:
    applying, by the MRI system, multiple sets of diffusion weighted imaging pulse sequences;
    acquiring, by the MRI system, multiple k-space data sets using the multiple sets of diffusion weighted imaging pulse sequences;
    reconstructing a magnetic resonance image from each of the multiple k-space data sets respectively;
    averaging magnitudes of the magnetic resonance images; and
    suppressing Nyquist ghost by generating an average magnitude magnetic resonance image based on the averaged magnitudes.

2. The method of claim 1, wherein acquiring multiple k-space data sets further comprises:
    applying, by the MRI system, a first set of diffusion weighted imaging pulse sequences;
    acquiring, by the MRI system, a first k-space data set using the first set of diffusion weighted imaging pulse sequence;
    applying, by the MRI system, a second set of diffusion weighted imaging pulse sequences; and
    acquiring, by the MRI system, a second k-space data set using the second set of diffusion weighted imaging pulse sequence; and
    wherein odd- and even-numbered echoes in the second k-space data set are swapped with respect to the first k-space data set.

3. The method of claim 1, wherein each of the multiple sets of diffusion weighted imaging pulse sequences includes a pulsed gradient spin echo (PGSE) portion and an echo-planar imaging (EPI) sequence following the PGSE portion.

4. The method of claim 3, wherein the PGSE portion comprises a diffusion gradient pair, one dephasing and one exactly opposite rephasing gradient.

5. The method of claim 3, wherein the EPI sequence comprises a blipped EPI sequence, wherein a phase-encoding gradient blip is placed at each frequency-encoding gradient reversal.

6. The method of claim 5, wherein acquiring multiple k-space data sets further comprises:
    acquiring a first k-space data set using a first set of diffusion weighted imaging pulse sequence which comprises a first blipped EPI sequence; and
    acquiring a second k-space data set using a second set of diffusion weighted imaging pulse sequence which comprises a second blipped EPI sequence; and
    wherein odd- and even-numbered echoes of the second blipped EPI sequence are swapped with respect to the first blipped EPI sequence.

7. The method of claim 6, wherein acquiring multiple k-space data sets further comprises:
   acquiring a third k-space data set using a third set of diffusion weighted imaging pulse sequence which comprises a third blipped EPI sequence; and
   acquiring a fourth k-space data set using a fourth set of diffusion weighted imaging pulse sequence which comprises a fourth blipped EPI sequence; and
   wherein odd- and even-numbered echoes of the third blipped EPI sequence are swapped with respect to the second blipped EPI sequence, and wherein odd- and even-numbered echoes of the fourth blipped EPI sequence are swapped with respect to the third blipped EPI sequence.

8. A magnetic resonance imaging (MRI) system comprising:
   gradient coils configured to generate encoding gradients;
   a radio frequency (RF) coil configured to generate RF pulses; and
   a processor connected to the gradient coils and the RF coil, the processor being configured to:
      instruct the gradient coils and the RF coil to generate multiple sets of diffusion weighted imaging pulse sequences to acquire multiple k-space data sets;
      reconstruct a magnetic resonance image from each of the multiple k-space data sets respectively;
      average magnitudes of the magnetic resonance images; and
      suppress Nyquist ghost by generating an average magnitude magnetic resonance image based on the averaged magnitudes.

9. The MRI system of claim 8, wherein acquiring multiple k-space data sets further comprises:
   acquiring a first k-space data set using a first set of diffusion weighted imaging pulse sequence; and
   acquiring a second k-space data set using a second set of diffusion weighted imaging pulse sequence; and
   wherein odd- and even-numbered echoes in the second k-space data set are swapped with respect to the first k-space data set.

10. The MRI system of claim 8, wherein each of the multiple sets of diffusion weighted imaging pulse sequences includes a PGSE portion and an EPI sequence following the PGSE portion.

11. The MRI system of claim 10, wherein the PGSE portion comprises a diffusion gradient pair, one dephasing and one exactly opposite rephasing gradient.

12. The MRI system of claim 10, wherein the EPI sequence comprises a blipped EPI sequence, wherein a phase-encoding gradient blip is placed at each frequency-encoding gradient reversal.

13. The MRI system of claim 8, wherein acquiring multiple k-space data sets further comprises:
   acquiring a first k-space data set using a first set of diffusion weighted imaging pulse sequence which comprises a first blipped EPI sequence; and
   acquiring a second k-space data set using a second set of diffusion weighted imaging pulse sequence which comprises a second blipped EPI sequence; and
   wherein odd- and even-numbered echoes of the second blipped EPI sequence are swapped with respect to the first blipped EPI sequence.

14. The MRI system of claim 13, wherein acquiring multiple k-space data sets further comprises:
   acquiring a third k-space data set using a third set of diffusion weighted imaging pulse sequence which comprises a third blipped EPI sequence; and
   acquiring a fourth k-space data set using a fourth set of diffusion weighted imaging pulse sequence which comprises a fourth blipped EPI sequence; and
   wherein odd- and even-numbered echoes of the third blipped EPI sequence are swapped with respect to the second blipped EPI sequence, and wherein odd- and even-numbered echoes of the fourth blipped EPI sequence are swapped with respect to the third blipped EPI sequence.

15. A method for suppressing Nyquist ghost in magnetic resonance imaging, the method performed by a magnetic resonance imaging (MRI) system including gradient coils, a radio frequency (RF) coil, and a processor connected to the gradient coils and the RF coil, the method comprising:
   applying, by the MRI system, a first set of imaging pulse sequences;
   acquiring, by the MRI system, a first k-space data set using the first set of imaging pulse sequences;
   applying, by the MRI system, a second sets of imaging pulse sequences;
   acquiring, by the MRI system, a second k-space data set using the second set of imaging pulse sequences, wherein odd- and even-numbered echoes of the second first k-space data set are swapped with respect to the first k-space data set;
   reconstructing a first magnetic resonance image from the first k-space data set;
   reconstructing a second magnetic resonance image from the second k-space data set; and
   averaging magnitudes of the first and second magnetic resonance images to generate an average magnitude magnetic resonance image.

16. The method of claim 15, wherein the first and second sets of imaging pulse sequences are diffusion weighted and each includes a PGSE portion and an EPI sequence following the PGSE portion.

17. The method of claim 16, wherein the PGSE portion comprises a diffusion gradient pair, one dephasing and one exactly opposite rephasing gradient.

18. The method of claim 16, wherein the EPI sequence comprises a blipped EPI sequence, wherein a phase-encoding gradient blip is placed at each frequency-encoding gradient reversal.

19. The method of claim 18, wherein odd- and even-numbered echoes of the blipped EPI sequence of the second set of imaging pulse sequences are swapped with respect to the blipped EPI sequence of the first set of imaging pulse sequences.

* * * * *